US011444189B2

(12) United States Patent
Tajima et al.

(10) Patent No.: US 11,444,189 B2
(45) Date of Patent: Sep. 13, 2022

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Jumpei Tajima, Mitaka (JP); Toshiki Hikosaka, Kawasaki (JP); Shinya Nunoue, Ichikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 157 days.

(21) Appl. No.: 17/013,986

(22) Filed: Sep. 8, 2020

(65) Prior Publication Data

US 2021/0184026 A1 Jun. 17, 2021

(30) Foreign Application Priority Data

Dec. 13, 2019 (JP) .............................. JP2019-225145
Sep. 3, 2020 (JP) .............................. JP2020-148004

(51) Int. Cl.
*H01L 29/778* (2006.01)
*H01L 29/205* (2006.01)
(Continued)

(52) U.S. Cl.
CPC ...... *H01L 29/7783* (2013.01); *H01L 29/2003* (2013.01); *H01L 29/205* (2013.01);
(Continued)

(58) Field of Classification Search
None
See application file for complete search history.

(56) References Cited

U.S. PATENT DOCUMENTS 8,664,696 B2 3/2014 Yoshioka et al.
8,860,089 B2 10/2014 Park et al.
(Continued)

FOREIGN PATENT DOCUMENTS

JP 2001-196575 A 7/2001
JP 2008-235613 A 10/2008
(Continued)

*Primary Examiner* — Jack S Chen
(74) *Attorney, Agent, or Firm* — Oblon, McClelland, Maier & Neustadt, L.L.P.

(57) ABSTRACT

According to one embodiment, a semiconductor device includes first, second, and third electrodes, first, second, and third semiconductor layers, and a first insulating member. The first semiconductor layer includes first, second, third, fourth, and fifth partial regions. A direction from the first partial region toward the second partial region is along a first direction. The first electrode includes a first electrode portion. A direction from the first electrode portion toward the second electrode is along the first direction. A second direction from the third partial region toward the third electrode crosses the first direction. The second semiconductor layer includes a first semiconductor portion and a second semiconductor portion. At least a portion of the first semiconductor layer is between the third and second semiconductor layers. The first insulating member includes a first insulating portion. The first insulating portion is provided between the third partial region and the third electrode.

15 Claims, 11 Drawing Sheets

(51) Int. Cl.
*H01L 29/66* (2006.01)
*H01L 29/207* (2006.01)
*H01L 29/20* (2006.01)
*H01L 29/423* (2006.01)

(52) U.S. Cl.
CPC ...... *H01L 29/207* (2013.01); *H01L 29/66462* (2013.01); *H01L 29/4236* (2013.01)

(56) References Cited

U.S. PATENT DOCUMENTS

| | | | |
|---|---|---|---|
| 8,883,581 | B2 | 11/2014 | Ohki |
| 2001/0020700 | A1 | 9/2001 | Inoue et al. |
| 2016/0260827 | A1 | 9/2016 | Nishimori et al. |
| 2021/0184028 | A1* | 6/2021 | Tajima ................. H01L 29/452 |
| 2022/0102512 | A1* | 3/2022 | Hikosaka ............ H01L 29/7786 |

FOREIGN PATENT DOCUMENTS

| | | | |
|---|---|---|---|
| JP | 2011-238654 | A | 11/2011 |
| JP | 2012-248632 | A | 12/2012 |
| JP | 2013-211481 | A | 10/2013 |
| JP | 2016-163017 | A | 9/2016 |

\* cited by examiner

_US 11,444,189 B2_

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2019-225145, filed on Dec. 13, 2019, and Japanese Patent Application No. 2020-148004, filed on Sep. 3, 2020; the entire contents of which are incorporated herein by reference.

FIELD

Embodiments of the invention generally relate to a semiconductor device and a method for manufacturing the semiconductor device.

BACKGROUND

For example, stable characteristics of a semiconductor device such as a transistor or the like are desirable.

DETAILED DESCRIPTION

Figure 1:
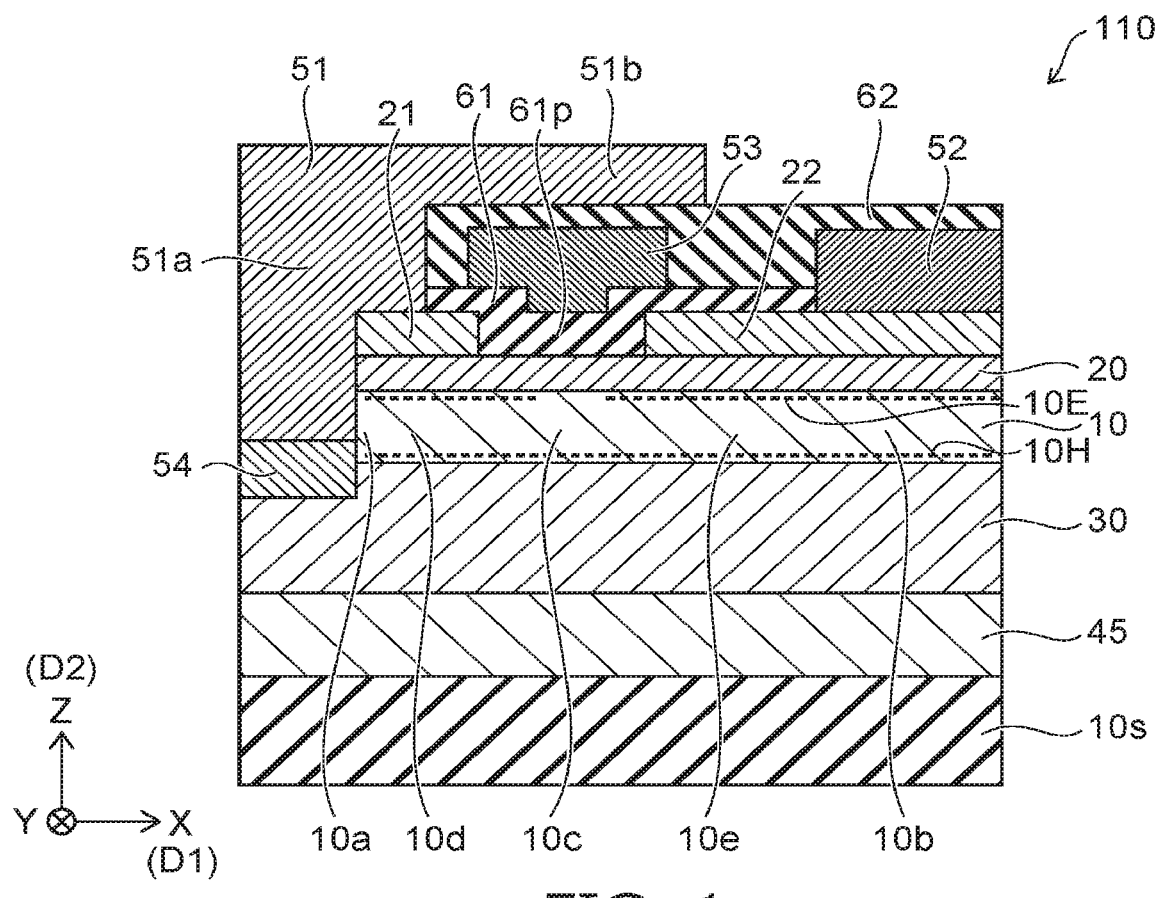
FIG. 1 is a schematic cross-sectional view illustrating a semiconductor device according to a first embodiment.

According to one embodiment, a semiconductor device includes a first electrode, a second electrode, a third electrode, a first semiconductor layer, a second semiconductor layer, a third semiconductor layer, and a first insulating member. The first semiconductor layer includes $Al_{x1}Ga_{1-x1}N$ (0≤x1<1). The first semiconductor layer includes a first partial region, a second partial region, a third partial region, a fourth partial region, and a fifth partial region. A direction from the first partial region toward the second partial region is along a first direction. A position in the first direction of the third partial region is between a position in the first direction of the first partial region and a position in the first direction of the second partial region. A position in the first direction of the fourth partial region is between the position in the first direction of the first partial region and the position in the first direction of the third partial region. A position in the first direction of the fifth partial region is between the position in the first direction of the third partial region and the position in the first direction of the second partial region. The first electrode includes a first electrode portion. A direction from the first electrode portion toward the second electrode is along the first direction. A position of the third electrode in the first direction is between a position of the first electrode portion in the first direction and a position of the second electrode in the first direction. A second direction from the third partial region toward the third electrode crosses the first direction. The second semiconductor layer includes $Al_{x2}Ga_{1-x2}N$ (0<x2≤1 and x1<x2). The second semiconductor layer includes a first semiconductor portion and a second semiconductor portion. A direction from the fourth partial region toward the first semiconductor portion is along the second direction. A direction from the fifth partial region toward the second semiconductor portion is along the second direction. The third semiconductor layer includes magnesium and $Al_{x3}Ga_{1-x3}N$ (0<x3<1 and x1<x3). At least a portion of the first semiconductor layer is between the third semiconductor layer and the second semiconductor layer. The first insulating member includes a first insulating portion. The first insulating portion is provided between the third partial region and the third electrode.

According to one embodiment, a semiconductor device includes a first electrode, a second electrode, a third electrode, a first semiconductor layer, a second semiconductor layer, a third semiconductor layer, and a first insulating member. The first semiconductor layer includes $Al_{x1}Ga_{1-x1}N$ (0≤x1<1). The first semiconductor layer includes a first partial region, a second partial region, a third partial region, a fourth partial region, and a fifth partial region. A direction from the first partial region toward the second partial region is along a first direction. A position in the first direction of the third partial region is between a position in the first direction of the first partial region and a position in the first direction of the second partial region. A position in the first direction of the fourth partial region is between the position in the first direction of the first partial region and the position in the first direction of the third partial region. A position in the first direction of the fifth partial region is between the position in the first direction of the third partial region and the position in the first direction of the second partial region. A second direction from the first partial region toward the first electrode crosses the first direction. A direction from the first electrode toward the second electrode is along the first direction. A direction from the second partial region toward the second electrode is along the second direction. A position of the third electrode in the first direction is between a position of the first electrode portion in the first direction and a position of the second electrode in the first direction. A direction from the third partial region toward the third electrode is along the second direction. The second semiconductor layer includes $Al_{x2}Ga_{1-x2}N$ (0<x2≤1 and x1<x2). The second semiconductor layer includes a first semiconductor portion and a second semiconductor portion. A direction from the fourth partial region toward the first semiconductor portion is along the second direction. A direction from the fifth partial region toward the second semiconductor portion is along the second direction. The third semiconductor layer includes magnesium and $Al_{x3}Ga_{1-x3}N$ (0<x3<1 and x1<x3). The third partial region is between the third semiconductor layer and the third electrode in the second direction. The third semiconductor layer is between the first partial region and the second partial region in the first direction. The first insulating member includes a first insulating portion. The first insulating portion is provided between the third partial region and the third electrode.

According to one embodiment, a method for manufacturing a semiconductor device is disclosed. The method can include preparing a structure body including a fourth semiconductor layer and a third semiconductor film. The fourth semiconductor layer includes $Al_{x4}Ga_{1-x4}N$ (0≤x4<1). The third semiconductor film includes magnesium and $Al_{x3}Ga_{1-x3}N$ (0≤x3<1). The method can include forming a third semiconductor layer by removing a portion of the third semiconductor film. The method can include forming a first semiconductor layer including $Al_{x1}Ga_{1-x1}N$ (0≤x1<1) on the third semiconductor layer and on the fourth semiconductor layer exposed by the removing of the portion of the third semiconductor film. The method can include forming a second semiconductor layer including $Al_{x2}Ga_{1-x2}N$ (0<x2≤1 and x1<x2) on the first semiconductor layer. The second semiconductor layer includes a first portion, a second portion, and a third portion. The third portion is above the third semiconductor layer. A position of the third portion in a first direction is between a position of the first portion in the first direction and a position of the second portion in the first direction. The first direction is from the first portion toward the second portion. In addition, the method can include forming a first electrode, a second electrode, and a third electrode. The first electrode is electrically connected to the first portion. The second electrode is electrically connected to the second portion. The third electrode is electrically connected to the third portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor layer 10, a second semiconductor layer 20, a third semiconductor layer 30, and a first insulating member 61. In the example, the semiconductor device 110 includes a substrate 10s and a semiconductor layer 45.

The first semiconductor layer 10 includes $Al_{x1}Ga_{1-x1}N$ (0≤x1<1). The composition ratio of Al in the first semiconductor layer 10 is, for example, 0.1 or less. The first semiconductor layer 10 includes, for example, GaN.

The first semiconductor layer 10 includes a first partial region 10a, a second partial region 10b, a third partial region 10c, a fourth partial region 10d, and a fifth partial region 10e. The direction from the first partial region 10a toward the second partial region 10b is along a first direction D1.

The first direction D1 is taken as an X-axis direction. One direction perpendicular to the X-axis direction is taken as a Z-axis direction. A direction perpendicular to the X-axis direction and the Z-axis direction is taken as a Y-axis direction.

The position in the first direction D1 of the third partial region 10c is between the position in the first direction D1 of the first partial region 10a and the position in the first direction D1 of the second partial region 10b. The position in the first direction D1 of the fourth partial region 10d is between the position in the first direction D1 of the first partial region 10a and the position in the first direction D1 of the third partial region 10c. The position in the first direction D1 of the fifth partial region 10e is between the position in the first direction D1 of the third partial region 10c and the position in the first direction D1 of the second partial region 10b.

In the example, the third partial region 10c is between the first partial region 10a and the second partial region 10b in the first direction D1. The fourth partial region 10d is between the first partial region 10a and the third partial region 10c in the first direction D1. The fifth partial region 10e is between the third partial region 10c and the second partial region 10b in the first direction D1.

The first electrode 51 includes a first electrode portion 51a. In the example, the first electrode 51 further includes a second electrode portion 51b. For example, the second electrode portion 51b is continuous with the first electrode portion 51a.

The direction from the first electrode portion 51a toward the second electrode 52 is along the first direction D1 (the X-axis direction).

The position of the third electrode 53 in the first direction D1 is between the position of the first electrode portion 51a in the first direction D1 and the position of the second electrode 52 in the first direction D1. A second direction D2 from the third partial region 10c toward the third electrode 53 crosses the first direction D1. The second direction D2 is, for example, the Z-axis direction.

The second semiconductor layer 20 includes $Al_{x2}Ga_{1-x2}N$ (0<x2≤1 and x1<x2). The composition ratio of Al in the second semiconductor layer 20 is, for example, not less than 0.1 and not more than 0.5. The second semiconductor layer 20 includes, for example, AlGaN.

The second semiconductor layer 20 includes a first semiconductor portion 21 and a second semiconductor portion 22. The direction from the fourth partial region 10d toward the first semiconductor portion 21 is along the second direction D2. The direction from the fifth partial region 10e toward the second semiconductor portion 22 is along the second direction D2.

The third semiconductor layer 30 includes magnesium (Mg) and $Al_{x3}Ga_{1-x3}N$ (0<x3<1 and x1<x3). For example, the third semiconductor layer 30 includes p-type AlGaN. The composition ratio of Al in the third semiconductor layer 30 is, for example, not less than 0.1 and not more than 0.4.

At least a portion of the first semiconductor layer 10 is between the third semiconductor layer 30 and the second semiconductor layer 20.

The first insulating member 61 includes a first insulating portion 61p. The first insulating portion 61p is provided between the third partial region 10c and the third electrode 53.

For example, the semiconductor layer 45 is provided on the substrate 10s. In the example, the semiconductor layer 45 is a buffer layer. For example, the semiconductor layer 45 includes multiple nitride semiconductor layers including Al. The third semiconductor layer 30 is provided on the semiconductor layer 45. The first semiconductor layer 10 is provided on the third semiconductor layer 30. The second semiconductor layer 20 is provided on the first semiconductor layer 10.

For example, a carrier region 10E is formed in a portion of the first semiconductor layer 10 at the second semiconductor layer 20 side. The carrier region 10E is, for example, a two-dimensional electron gas.

For example, the first electrode 51 functions as a source electrode. For example, the second electrode 52 functions as a drain electrode. For example, the third electrode 53 functions as a gate electrode. For example, the first insulating member 61 functions as a gate insulating film. A current that flows between the first electrode 51 and the second electrode 52 can be controlled by controlling the potential of the third electrode 53. The semiconductor device 110 is, for example, a HEMT (High Electron Mobility Transistor).

For example, the first electrode 51 is electrically connected to the first partial region 10a of the first semiconductor layer 10. For example, the second electrode 52 is electrically connected to the second partial region 10b of the first semiconductor layer 10. For example, the first semiconductor layer 10 corresponds to a channel layer. The second semiconductor layer 20 corresponds to a blocking layer.

The third semiconductor layer 30 (the AlGaN layer) that includes Mg is provided in the semiconductor device 110. A high threshold voltage is more easily obtained because a layer including Mg is provided. For example, a normally-off characteristic is more easily obtained.

The third semiconductor layer 30 includes AlGaN. For example, a carrier region 10H is formed in a portion of the first semiconductor layer 10 at the third semiconductor layer 30 side. The carrier region 10H is, for example, a two-dimensional hole gas. For example, the carrier region 10H is electrically connected to the first electrode portion 51a of the first electrode 51. For example, the first electrode portion 51a is electrically connected to the third semiconductor layer 30 via the carrier region 10H. The potential of the third semiconductor layer 30 is controlled to be the potential of the first electrode portion 51a. The potential of the third semiconductor layer 30 is more stably controlled. More stable characteristics are obtained thereby.

In the embodiment, a semiconductor device can be provided in which stable characteristics are obtained.

As described above, the third semiconductor layer 30 includes AlGaN. On the other hand, for example, when the third semiconductor layer 30 is AlN, the flatness of the first semiconductor layer 10 degrades. For example, when the third semiconductor layer 30 is AlN, the crystal quality is low.

When the third semiconductor layer 30 includes AlGaN, the first semiconductor layer 10 is interposed between the third semiconductor layer 30 of AlGaN and the second semiconductor layer 20 of AlGaN. For example, the distortion of the crystal is relaxed. Good crystal quality is obtained thereby. More stable characteristics are more easily obtained.

It is favorable for the Mg concentration in the third semiconductor layer 30 to be, for example, $5 \times 10^{18}$ cm$^{-3}$ or less. The unintended mixing of Mg into the second semiconductor layer 20 can be suppressed thereby. The Mg concentration in the third semiconductor layer 30 may be, for example, $1 \times 10^{17}$ cm$^{-3}$ or more.

In the example, the semiconductor device 110 includes a conductive member 54. For example, the conductive member 54 contacts the third semiconductor layer 30 and the first electrode portion 51a. The conductive member 54 is, for example, a contact metal.

The conductive member 54 includes, for example, at least one selected from the group consisting of Ni, Pd, Ag, and Au. A good electrical connection is obtained.

The first electrode portion 51a includes, for example, at least one selected from the group consisting of Ti and Al. For example, a low resistance is easily obtained.

In the example as described above, the first electrode 51 includes the second electrode portion 51b. The direction from the third electrode 53 toward the second electrode portion 51b is along the second direction D2 (e.g., the Z-axis direction). A second insulating member 62 is provided between the third electrode 53 and the second electrode portion 51b. For example, the position in the first direction D1 (the X-axis direction) of the end portion of the second electrode portion 51b is between the position in the first direction D1 of the third electrode 53 and the position in the first direction D1 of the second electrode 52. For example, the second electrode portion 51b functions as a field plate. Electric field concentration is relaxed by the second electrode portion 51b. For example, the breakdown voltage is increased.

In the embodiment, the substrate 105 includes, for example, silicon. The substrate 105 may include, for example, sapphire, SiC, or GaN. The semiconductor layer 45 (e.g., the buffer layer) includes, for example, AlN. The semiconductor layer 45 may include, for example, a stacked body in which multiple AlGaN layers are stacked. For example, the semiconductor layer 45 may have a superlattice structure in which a GaN layer and an AlN layer are periodically stacked.

Several examples of semiconductor devices according to the embodiment will now be described. Several differences with the semiconductor device 110 will be described.

Figure 2:
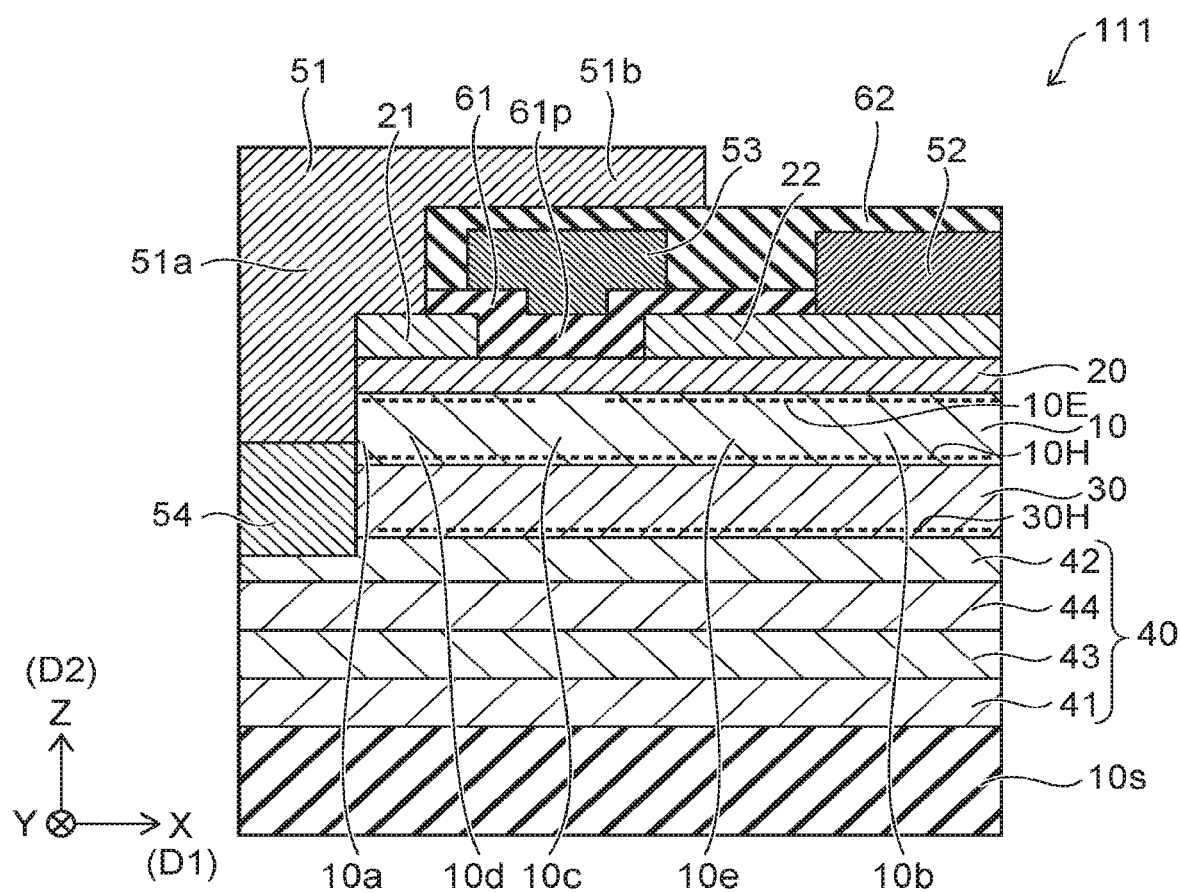
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, the semiconductor device 111 according to the embodiment includes a fourth semiconductor layer 40 in addition to the first electrode 51, the second electrode 52, the third electrode 53, the first semiconductor layer 10, the second semiconductor layer 20, the third semiconductor layer 30, and the first insulating member 61. An example of the fourth semiconductor layer 40 will now be described.

The fourth semiconductor layer 40 includes, for example, $Al_{x4}Ga_{1-x4}N$ ($0<x4<1$ and $x1<x4$). The fourth semiconductor layer 40 includes, for example, AlGaN. The third semiconductor layer 30 is between the fourth semiconductor layer 40 and the second semiconductor layer 20 in the second direction D2. The first semiconductor layer 10 is between the third semiconductor layer 30 and the second semiconductor layer 20.

The fourth semiconductor layer 40 includes a first semiconductor region 41 and a second semiconductor region 42. The second semiconductor region 42 is between the first semiconductor region 41 and the third semiconductor layer 30. The composition ratio of Al in the first semiconductor region 41 is greater than the composition ratio of Al in the second semiconductor region 42.

In the semiconductor device 111, a region where the composition ratio of Al is high and a region where the composition ratio of Al is low are provided in the fourth semiconductor layer 40.

For example, the composition ratio of Al in the fourth semiconductor layer 40 decreases in the orientation from the fourth semiconductor layer 40 toward the third semiconductor layer 30.

In the example, the fourth semiconductor layer 40 includes a third semiconductor region 43. The third semiconductor region 43 is between the first semiconductor region 41 and the second semiconductor region 42. The composition ratio of Al in the third semiconductor region 43 is between the composition ratio of Al in the first semiconductor region 41 and the composition ratio of Al in the second semiconductor region 42.

In the example, the fourth semiconductor layer 40 includes a fourth semiconductor region 44. The fourth semiconductor region 44 is between the third semiconductor region 43 and the second semiconductor region 42. The composition ratio of Al in the fourth semiconductor region 44 is between the composition ratio of Al in the third semiconductor region 43 and the composition ratio of Al in the second semiconductor region 42.

The composition ratio of Al in the first semiconductor region 41 is, for example, about 60%. The composition ratio of Al in the third semiconductor region 43 is, for example, about 40%. The composition ratio of Al in the fourth semiconductor region 44 is, for example, about 35%. The composition ratio of Al in the first semiconductor region 41 is, for example, about 30%.

Figure 3:
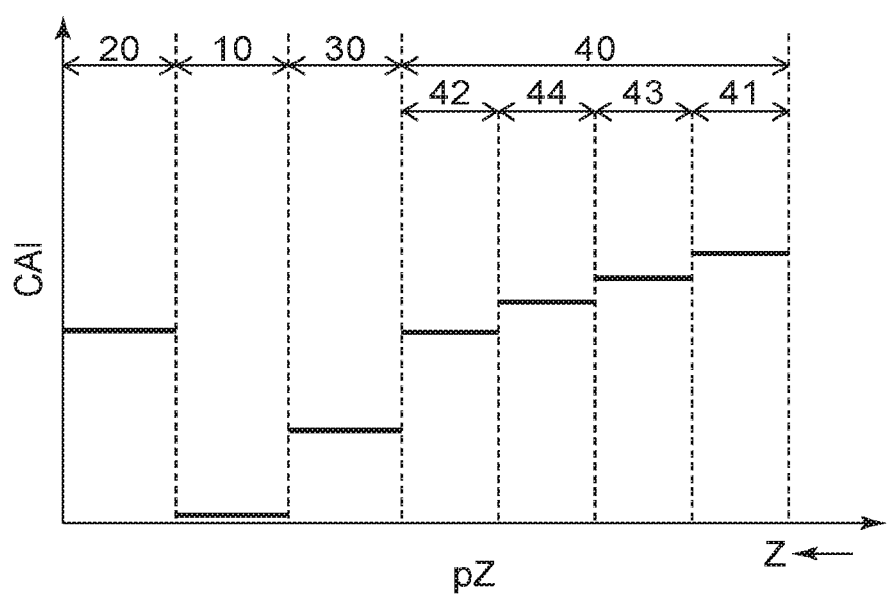
FIG. 3 is a graph illustrating the semiconductor device according to the first embodiment.

FIG. 3 is a graph illustrating the semiconductor device according to the first embodiment.

The horizontal axis of FIG. 3 is the position pZ in the Z-axis direction. The vertical axis is an Al composition ratio CAl. As shown in FIG. 3, the composition ratio of Al in the fourth semiconductor layer 40 decreases in the orientation from the fourth semiconductor layer 40 toward the third semiconductor layer 30.

The Al composition ratio CAl in the third semiconductor layer 30 is not more than the minimum value of the composition ratio of Al in the fourth semiconductor layer 40.

For example, as shown in FIG. 2, a carrier region 30H is formed in a portion of the third semiconductor layer 30 at the fourth semiconductor layer 40 side. The carrier region 30H is, for example, a two-dimensional hole gas. The third semiconductor layer 30 is electrically connected to the first electrode 51 by the carrier region 30H. For example, the potential of the third semiconductor layer 30 is more stably controlled.

For example, the minimum value of the Al composition ratio CAl in the fourth semiconductor layer 40 is not less than 0.15 and not more than 0.4. For example, the Al composition ratio CAl in the fourth semiconductor layer 40 has the minimum value in the second semiconductor region 42.

For example, the maximum value of the composition ratio of Al in the fourth semiconductor layer 40 is greater than 0.4 and not more than 0.8. For example, the Al composition ratio CAl in the fourth semiconductor layer 40 has the maximum value in the first semiconductor region 41.

Figure 4:
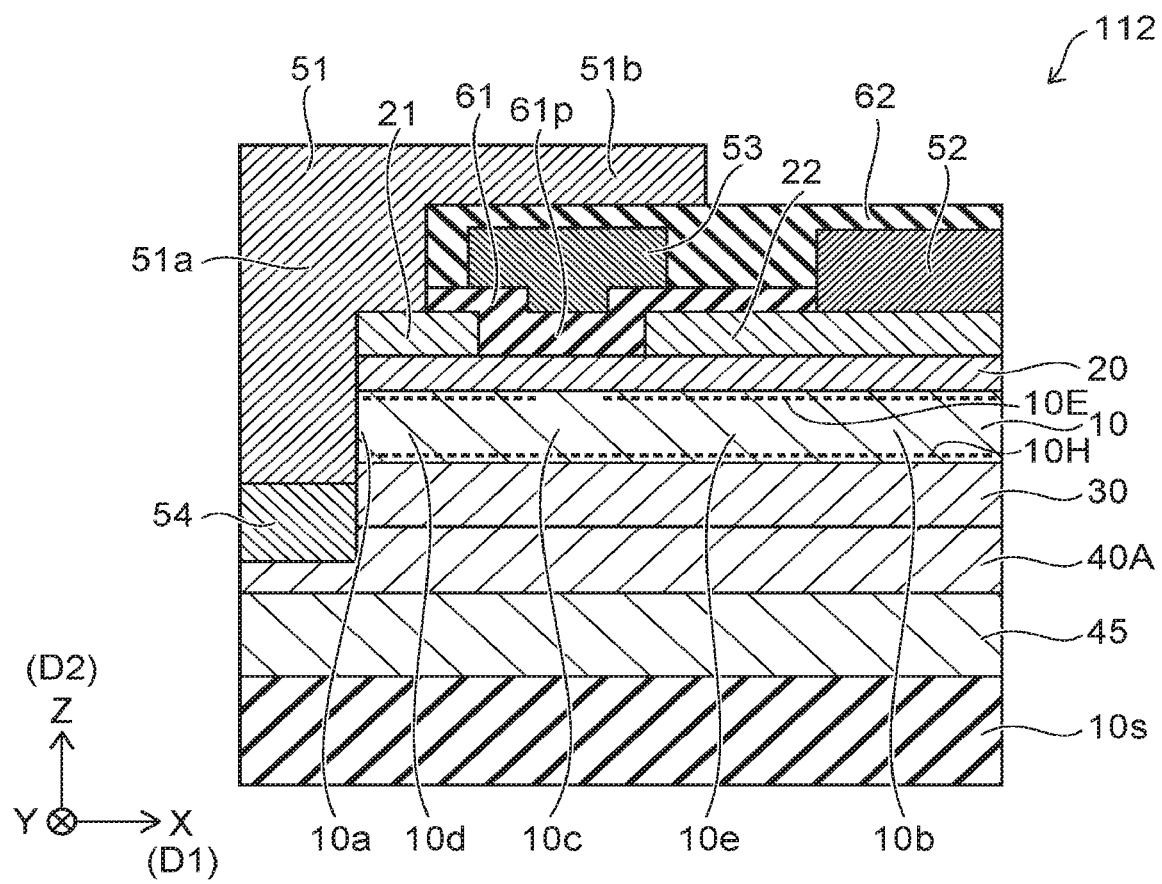
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, the semiconductor device 112 according to the embodiment includes a fourth semiconductor layer 40A in addition to the first electrode 51, the second electrode 52, the third electrode 53, the first semiconductor layer 10, the second semiconductor layer 20, the third semiconductor layer 30, and the first insulating member 61. An example of the fourth semiconductor layer 40A will now be described.

The fourth semiconductor layer 40A includes magnesium and $Al_{x4}Ga_{1-x4}N$ ($0 \leq x4 < 1$ and $x4 < x3$). The composition ratio of Al in the fourth semiconductor layer 40A may be 0.1 or less. The fourth semiconductor layer 40A includes, for example, GaN including Mg. The fourth semiconductor layer 40A includes, for example, p-type GaN.

The third semiconductor layer 30 is between the fourth semiconductor layer 40A and the second semiconductor layer 20 in the second direction D2. The first semiconductor layer 10 is between the third semiconductor layer 30 and the second semiconductor layer 20.

The magnesium concentration in the fourth semiconductor layer 40A is greater than the magnesium concentration in the third semiconductor layer 30.

The fourth semiconductor layer 40A is a GaN layer having a high Mg concentration. The third semiconductor layer 30 is an AlGaN layer having a low Mg concentration. For example, the fourth semiconductor layer 40A is electrically connected to the third semiconductor layer 30. For example, the fourth semiconductor layer 40A contacts the third semiconductor layer 30.

For example, the fourth semiconductor layer 40A is electrically connected to the first electrode 51. The potential of the fourth semiconductor layer 40A is stabilized thereby. The potential of the third semiconductor layer 30 also is stabilized. Thereby, for example, the threshold voltage is stably and easily controlled.

For example, it was found that when a second nitride semiconductor layer (e.g., the first semiconductor layer 10) that does not include Mg is directly grown on a first nitride semiconductor layer (e.g., the fourth semiconductor layer 40A and the third semiconductor layer 30) that includes Mg, the Mg is introduced also to the second nitride semiconductor layer, and an unintentionally high concentration of Mg is included in the second nitride semiconductor layer. For example, it is considered that this is because Mg remains inside the processing apparatus when forming the first nitride semiconductor layer, and the remaining Mg is incorporated into the second nitride semiconductor layer when forming the second nitride semiconductor layer.

In the embodiment, the third semiconductor layer 30 that includes a low concentration of Mg is formed on the fourth semiconductor layer 40A that includes a high concentration of Mg, and the first semiconductor layer 10 is formed on the third semiconductor layer 30. For example, it was found that the unintentional introduction of Mg into the first semiconductor layer 10 can be suppressed thereby. For example, it was found that Mg is easily incorporated into the fourth semiconductor layer 40 by reducing the partial pressure of ammonia when forming the fourth semiconductor layer 40. On the other hand, it was found that Mg is not easily incorporated into the third semiconductor layer 30 when the partial pressure of ammonia is high when forming the third semiconductor layer 30. By such conditions, the fourth semiconductor layer 40 that has a high Mg concentration and the third semiconductor layer 30 that has a low Mg concentration may be formed.

For example, the first semiconductor layer 10 substantially does not include a p-type impurity (e.g., magnesium (Mg)). The concentration of the p-type impurity in the first semiconductor layer 10 is $1 \times 10^{18}$ cm$^{-3}$ or less. For example, high carrier mobility is obtained by setting the concentration of the p-type impurity to be low.

In the embodiment, for example, the magnesium concentration in the third semiconductor layer 30 is less than $2 \times 10^{18}$ cm$^{-3}$. The magnesium concentration in the fourth semiconductor layer 40A is $2 \times 10^{18}$ cm$^{-3}$ or more. For example, the average value of the magnesium concentration in the third semiconductor layer 30 is not more than 1/10 of the average value of the magnesium concentration in the fourth semiconductor layer 40. By such a concentration, for example, the electrical connection to the first electrode 51 is possible while suppressing the unintended mixing of Mg into the first semiconductor layer 10.

In the embodiment, the concentration of carbon (C) in the third semiconductor layer 30 may be less than the carbon concentration in the first semiconductor layer 10. For example, in a nitride semiconductor that includes Mg, the carbon functions as an n-type impurity. By including carbon in the first semiconductor layer 10, the function of Mg as a p-type impurity is suppressed even when Mg is included in the first semiconductor layer 10 due to diffusion, etc. For example, the conductivity type of the first semiconductor layer 10 is suppressed. More stable characteristics are more easily obtained.

Examples of the profile of Mg and the profile of carbon in the semiconductor device 112 will now be described.

Figure 5A:
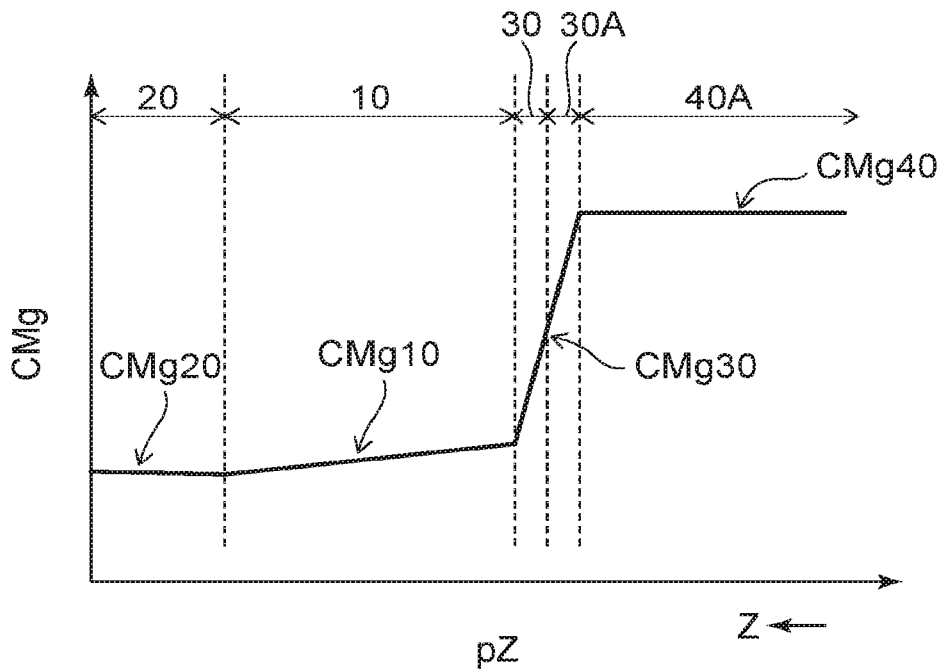
FIGS. 5A and 5B are graphs illustrating the semiconductor device according to the embodiment.
Figure 5B:
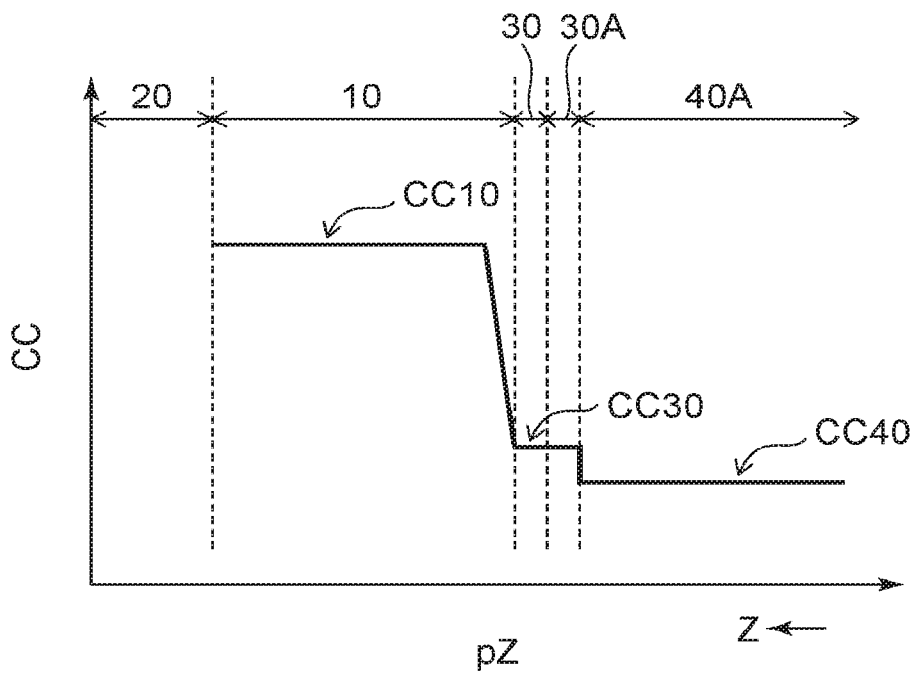

FIGS. 5A and 5B are graphs illustrating the semiconductor device according to the embodiment. FIG. 5A schematically illustrates the concentration profile of Mg in the semiconductor device. FIG. 5B schematically illustrates the concentration profile of C (carbon) in the semiconductor device. In these figures, the horizontal axis is the position pZ along the Z-axis direction. The vertical axis of FIG. 5A is a Mg concentration CMg (logarithmic). The vertical axis of FIG. 5B is a C concentration CC (logarithmic).

As shown in FIG. 5A, a Mg concentration CMg40A in the fourth semiconductor layer 40A is greater than a Mg concentration CMg30 in the third semiconductor layer 30. As shown in FIG. 5A, the Mg concentration CMg may abruptly decrease in a region 30A between the fourth semiconductor layer 40A and the third semiconductor layer 30. A Mg concentration CMg10 in the first semiconductor layer 10 and a Mg concentration CMg20 in the second semiconductor layer 20 are less than the Mg concentration CMg40A in the fourth semiconductor layer 40A.

As shown in FIG. 5B, a C concentration CC30 in the third semiconductor layer 30 is less than a C concentration CC10 in the first semiconductor layer 10. For example, a low concentration CC30 may be obtained in the third semiconductor layer 30 by setting the partial pressure of ammonia when forming the third semiconductor layer 30 to be greater than the partial pressure of ammonia when forming the fourth semiconductor layer 40A. In the example, a C concentration CC40 in the fourth semiconductor layer 40A is not more than the C concentration CC30 in the third semiconductor layer 30.

Figure 6A:
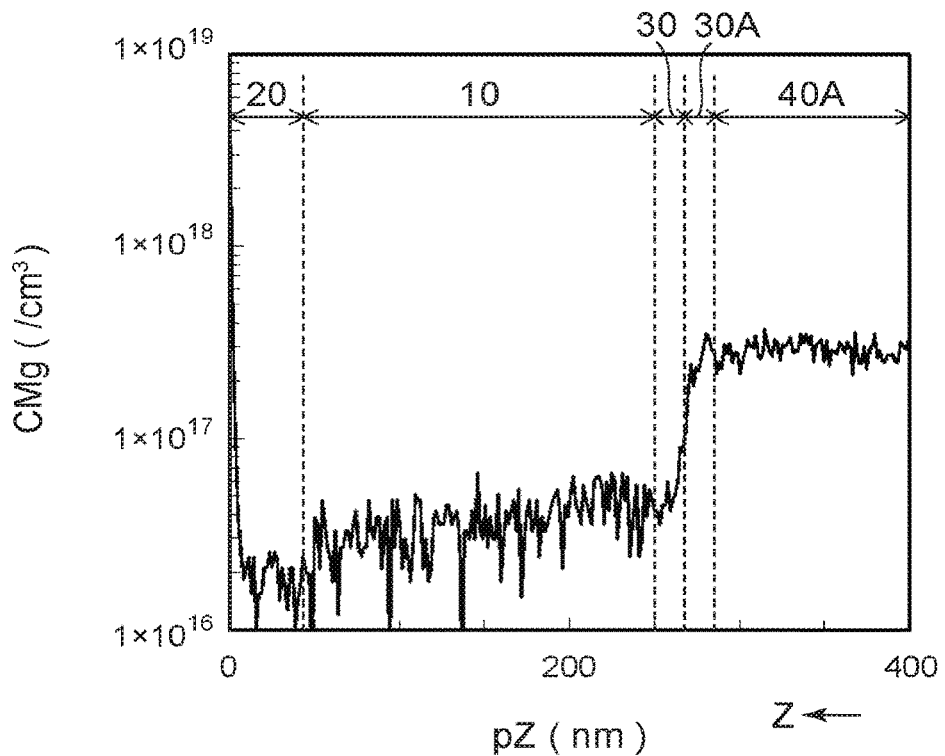
FIGS. 6A and 6B are graphs illustrating the semiconductor device according to the embodiment.
Figure 6B:
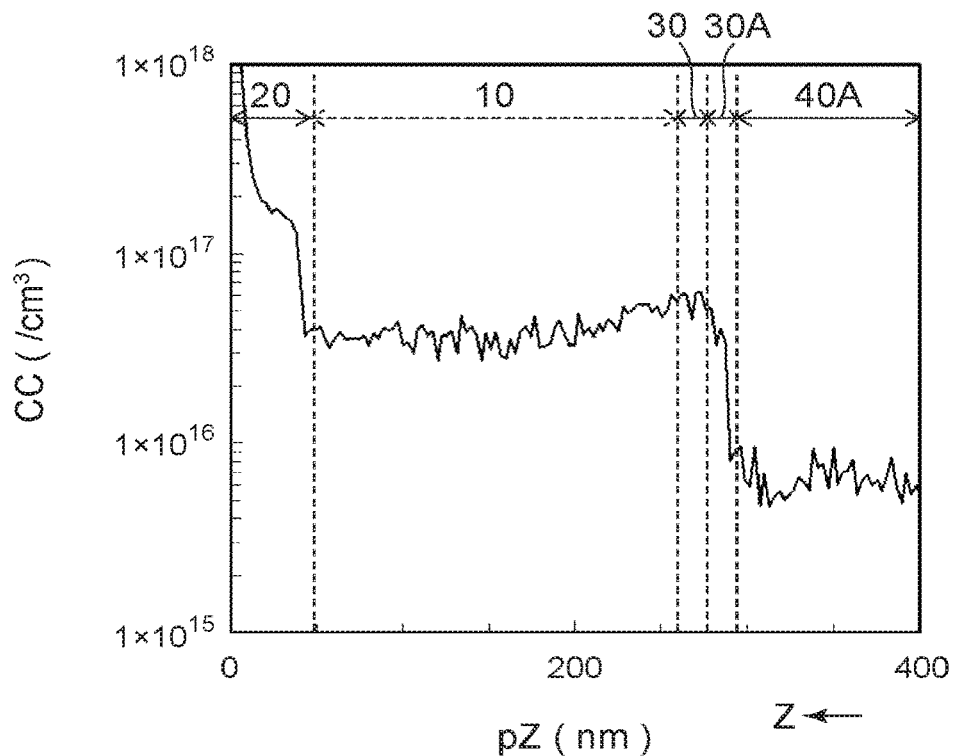

FIGS. 6A and 6B are graphs illustrating the semiconductor device according to the embodiment. These figures illustrate SIMS (Secondary Ion Mass Spectrometry) analysis results of the semiconductor device. In these figures, the horizontal axis is the position pZ along the Z-axis direction. The vertical axis of FIG. 6A is the Mg concentration CMg (logarithmic). The vertical axis of FIG. 6B is the C concentration CC (logarithmic).

As shown in FIG. 6A, the Mg concentration CMg in the fourth semiconductor layer 40A is greater than the Mg concentration CMg in the third semiconductor layer 30. As shown in FIG. 6B, the C concentration CC in the third semiconductor layer 30 is less than the Mg concentration CC in the first semiconductor layer 10. A semiconductor device can be provided in which stable characteristics are obtained.

Figure 7:
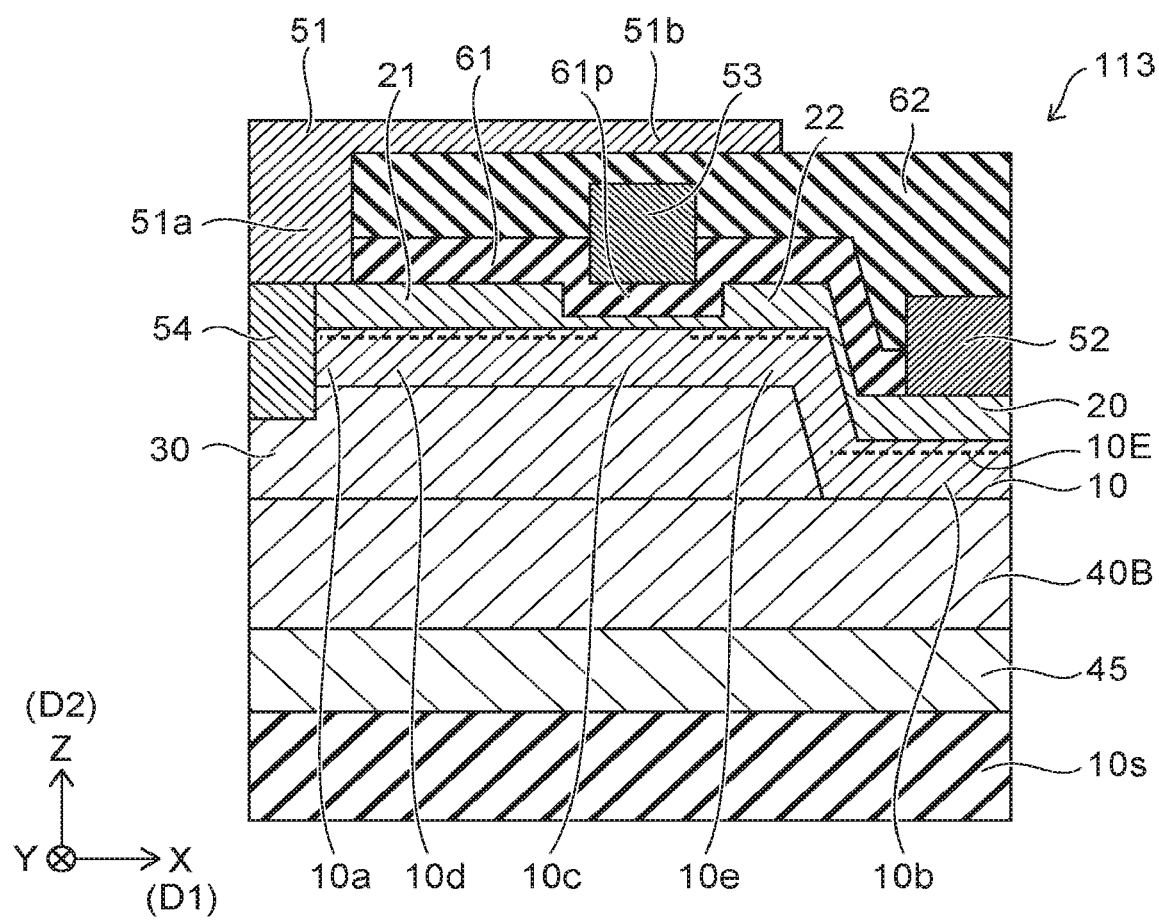
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, the semiconductor device 113 according to the embodiment includes the first electrode 51, the second electrode 52, the third electrode 53, the first semiconductor layer 10, the second semiconductor layer 20, the third semiconductor layer 30, and the first insulating member 61. The configurations of the semiconductor layers of the semiconductor device 113 are different from the configurations of the semiconductor layers of the semiconductor device 110. Examples of the semiconductor layers of the semiconductor device 113 will now be described.

As shown in FIG. 7, the fourth partial region 10d of the first semiconductor layer 10 is between the third semiconductor layer 30 and the first semiconductor portion 21 in the second direction D2. The third partial region 10c is between the third semiconductor layer 30 and the third electrode 53 in the second direction D2. The direction from the third semiconductor layer 30 toward the second partial region 10b is along the first direction D1.

In the semiconductor device 113, the third semiconductor layer 30 is not provided under the second electrode 52, but the third semiconductor layer 30 is provided under the first electrode 51 and under the second electrode 52. In the semiconductor device 113 as well, the potential of the third semiconductor layer 30 is controlled to be the potential of the first electrode portion 51a. The potential of the third semiconductor layer 30 is more stably controlled. More stable characteristics are obtained thereby.

As shown in FIG. 7, the conductive member 54 may be provided in the semiconductor device 113. For example, the conductive member 54 contacts the third semiconductor layer 30 and the first electrode portion 51a.

For example, the semiconductor device 120 may further include a fourth semiconductor layer 40B. The fourth semiconductor layer 40B includes $Al_{x4}Ga_{1-x4}N$ ($0 \leq x4 < 1$). The fourth semiconductor layer 40B includes, for example, GaN. The third semiconductor layer 30 is between the third partial region 10c and at least a portion of the fourth semiconductor layer 40B.

In the semiconductor devices 110 to 113 described above, the direction from the first semiconductor portion 21 of the second semiconductor layer 20 toward at least a portion of the first insulating portion 61p is along the first direction (the X-axis direction). For example, a trench is formed by removing a portion of the second semiconductor layer 20. The first insulating member 61 is formed inside the trench. The third electrode 53 is formed in the remaining space. The third electrode 53 is, for example, a trench gate. For example, a high threshold is more easily obtained.

For example, the first insulating portion 61p is between the first semiconductor portion 21 and the second semiconductor portion 22 in the first direction (the X-axis direction). For example, at least a portion of the third electrode 53 may be provided between the first semiconductor portion 21 and the second semiconductor portion 22 in the first direction (the X-axis direction).

Second Embodiment

Figure 8:
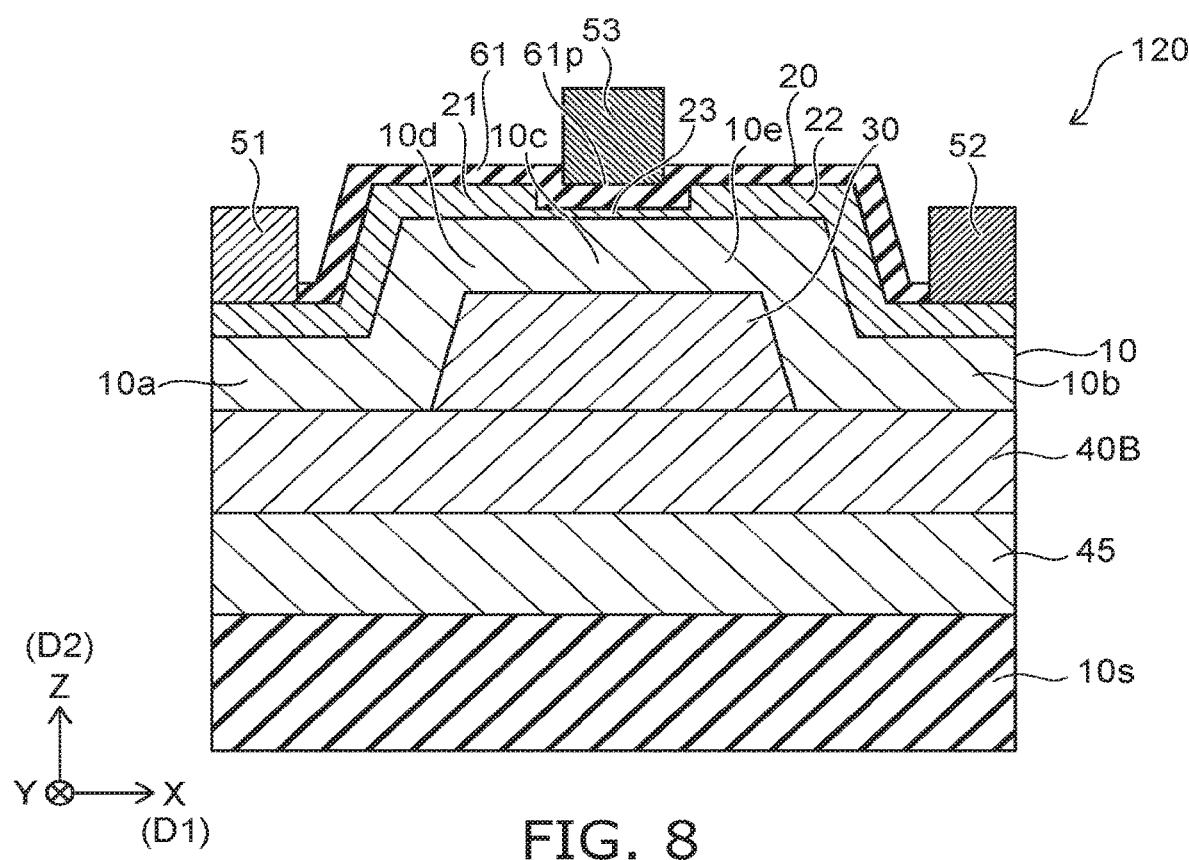
FIG. 8 is a schematic cross-sectional view illustrating a semiconductor device according to a second embodiment.

FIG. 8 is a schematic cross-sectional view illustrating a semiconductor device according to a second embodiment.

As shown in FIG. 8, the semiconductor device 120 according to the embodiment includes the first electrode 51, the second electrode 52, the third electrode 53, the first semiconductor layer 10, the second semiconductor layer 20, the third semiconductor layer 30, and the first insulating member 61. In the example, the semiconductor device 130 includes the substrate 10s and the semiconductor layer 45.

The direction from the first electrode 51 toward the second electrode 52 is along the first direction D1. The first direction D1 is the X-axis direction.

The position in the first direction D1 of the third electrode 53 is between the position in the first direction of the first electrode 51 and the position in the first direction D1 of the second electrode 52.

The first semiconductor layer 10 includes $Al_{x1}Ga_{1-x1}N$ ($0 \leq x1 < 1$). The composition ratio of Al in the first semiconductor layer 10 is, for example, 0.1 or less. The first semiconductor layer 10 includes, for example, GaN.

The first semiconductor layer 10 includes the first partial region 10a, the second partial region 10b, the third partial region 10c, the fourth partial region 10d, and the fifth partial region 10e. The direction from the first partial region 10a toward the first electrode 51 is along the second direction D2. The second direction D2 crosses the first direction D1. The second direction D2 is, for example, the Z-axis direction.

The direction from the second partial region 10b toward the second electrode 52 is along the second direction D2. The direction from the third partial region 10c toward the third electrode 53 is along the second direction D2.

The position in the first direction D1 of the fourth partial region 10d is between the position in the first direction D1 of the first partial region 10a and the position in the first direction D1 of the third partial region 10c. The position in the first direction D1 of the fifth partial region 10e is between the position in the first direction D1 of the third partial region 10c and the position in the first direction D1 of the second partial region 10b.

The second semiconductor layer 20 includes $Al_{x2}Ga_{1-x2}N$ ($0 < x2 \leq 1$ and $x1 < x2$). The composition ratio of Al in the second semiconductor layer 20 is, for example, not less than 0.1 and not more than 0.5. The second semiconductor layer 20 includes, for example, AlGaN.

The second semiconductor layer 20 includes the first semiconductor portion 21 and the second semiconductor portion 22. The direction from the fourth partial region 10d toward the first semiconductor portion 21 is along the second direction D2. The direction from the fifth partial region 10e toward the second semiconductor portion 22 is along the second direction D2.

The third semiconductor layer 30 includes magnesium and $Al_{x3}Ga_{1-x3}N$ ($0 \leq x3 < 1$). For example, the third semiconductor layer 30 includes p-type GaN. The third semiconductor layer 30 may include p-type AlGaN.

The third partial region 10c is between the third semiconductor layer 30 and the third electrode 53 in the second direction D2. The third semiconductor layer 30 is between the first partial region 10a and the second partial region 10b in the first direction D1.

The first insulating member 61 includes the first insulating portion 61p. The first insulating portion 61p is provided between the third partial region 10c and the third electrode 53.

For example, the threshold voltage can be increased by the p-type third semiconductor layer 30. For example, a normally-off characteristic is easily obtained.

For example, the first semiconductor layer 10 is provided at the upper surface and the side surface of the third semiconductor layer 30. The potential of the third semiconductor layer 30 is stable. A stable threshold voltage is obtained.

In the semiconductor device 120, the fourth partial region 10d is between the third semiconductor layer 30 and the first semiconductor portion 21 in the second direction D2. The fifth partial region 10e is between the third semiconductor layer 30 and the second semiconductor portion 22 in the second direction D2.

The second semiconductor layer 20 may further include a third semiconductor portion 23. The third semiconductor portion 23 is between the third partial region 10c and the third electrode 53 in the second direction D2.

For example, the second semiconductor layer 20 may cover the upper surface and the side surface of the first semiconductor layer 10.

For example, the semiconductor device 120 may further include the fourth semiconductor layer 40B. The fourth semiconductor layer 40B includes $Al_{x4}Ga_{1-x4}N$ ($0 \leq x4 < 1$). The fourth semiconductor layer 40B includes, for example, GaN.

The third semiconductor layer 30 is between the third partial region 10c and at least a portion of the fourth semiconductor layer 40B. The fourth semiconductor layer 40B substantially does not include magnesium. For example, the magnesium concentration in the fourth semiconductor layer 40B is less than the magnesium concentration in the third semiconductor layer 30.

In the semiconductor device 120, for example, the threshold voltage is low in regions where the third semiconductor layer 30 does not exist. For example, a low resistivity is obtained. For example, a low on-resistance is obtained.

In the semiconductor device 120, the composition ratio of Al in the third semiconductor layer 30 is not less than 0.1 and not more than 0.4. The composition ratio of Al in the fourth semiconductor layer 40B is, for example, not less than 0 and not more than 0.1. The composition ratio of Al in the first semiconductor layer 10 is, for example, not less than 0 and not more than 0.1.

Third Embodiment

A third embodiment relates to a method for manufacturing the semiconductor device 120.

FIGS. 9A, 9B, 10A, and 10B are schematic cross-sectional views illustrating the method for manufacturing the semiconductor device according to the third embodiment.

Figure 9A:
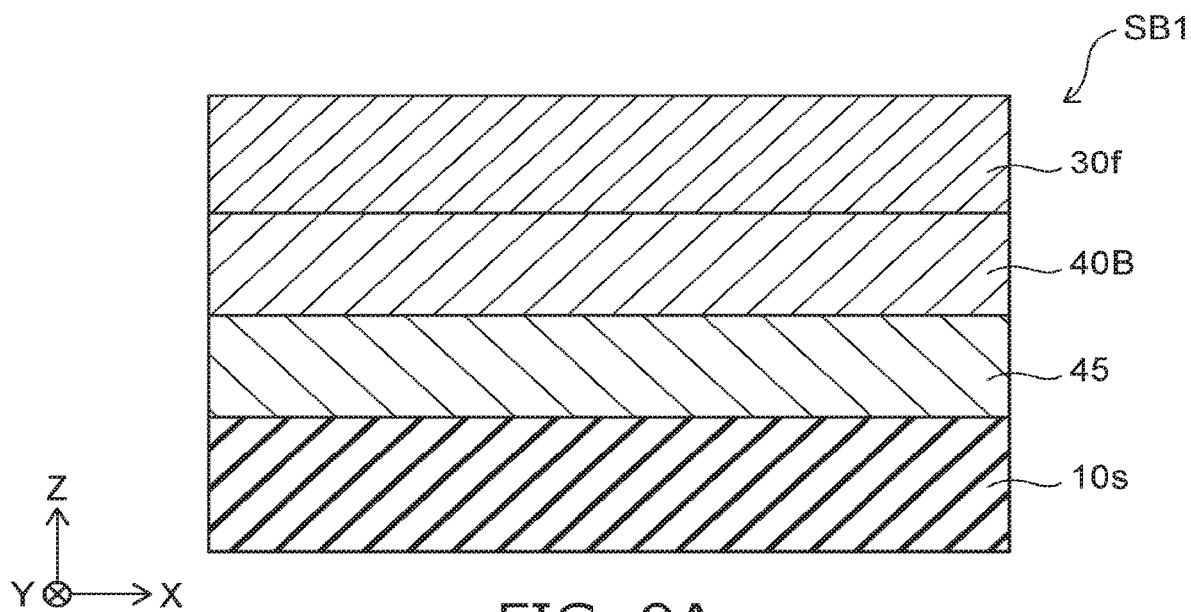
FIGS. 9A and 9B are schematic cross-sectional views illustrating the method for manufacturing the semiconductor device according to the third embodiment.

A structure body SB1 is prepared as shown in FIG. 9A. The structure body SB1 includes the fourth semiconductor layer 40B that includes $Al_{x4}Ga_{1-x4}N$ ($0 \leq x4 < 1$), and a third semiconductor film 30f that includes magnesium and $Al_{x3}Ga_{1-x3}N$ ($0 \leq x3 < 1$). In the example, the structure body SB1 includes the substrate 10s and the semiconductor layer 45. The semiconductor layer 45 is provided on the substrate 10s. The semiconductor layer 45 is a buffer layer. The fourth semiconductor layer 40B is provided on the semiconductor layer 45. The third semiconductor film 30f is provided on the fourth semiconductor layer 40B.

Figure 9B:
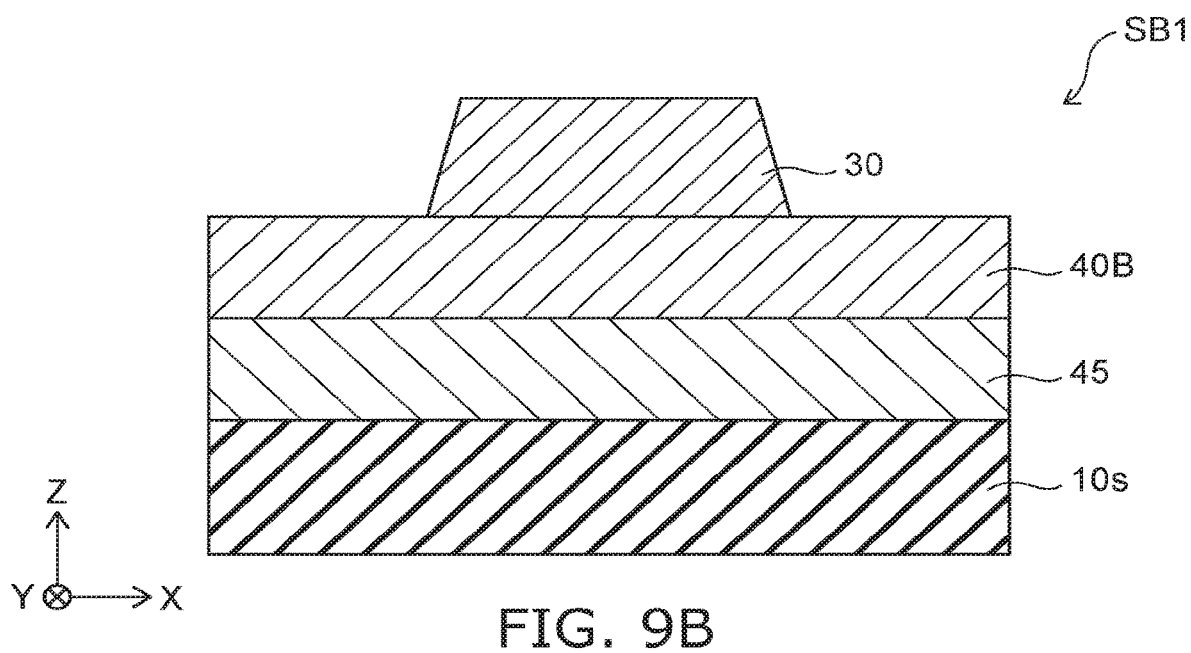

A portion of the third semiconductor film 30f is removed as shown in FIG. 9B. The third semiconductor layer 30 is formed thereby. The remaining third semiconductor film 30f is used to form the third semiconductor layer 30. A portion of the fourth semiconductor layer 40B is exposed by removing the portion of the third semiconductor film 30f.

Figure 10A:
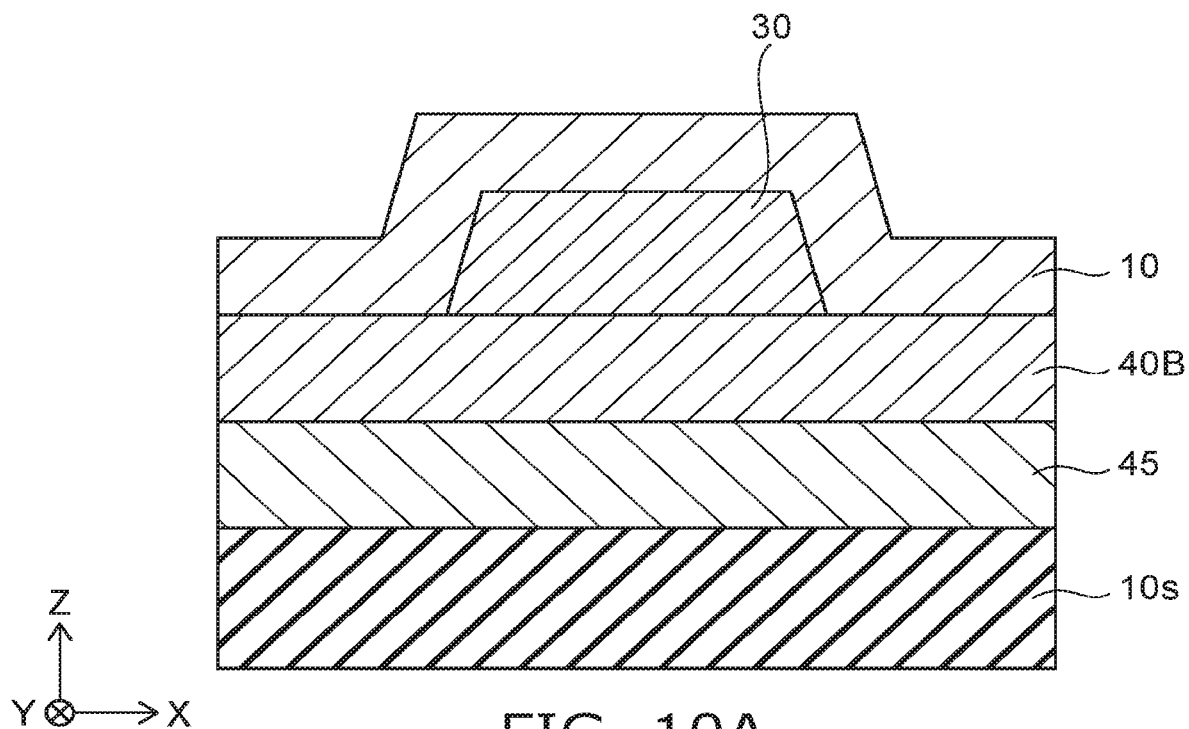
FIGS. 10A and 10B are schematic cross-sectional views illustrating the method for manufacturing the semiconductor device according to the third embodiment.

As shown in FIG. 10A, the first semiconductor layer 10 is formed on the third semiconductor layer 30 and on the fourth semiconductor layer 40B exposed by the removal of the portion of the third semiconductor film 30f. The first semiconductor layer 10 includes $Al_{x1}Ga_{1-x1}N$ ($0 \leq x1 < 1$).

Figure 10B:
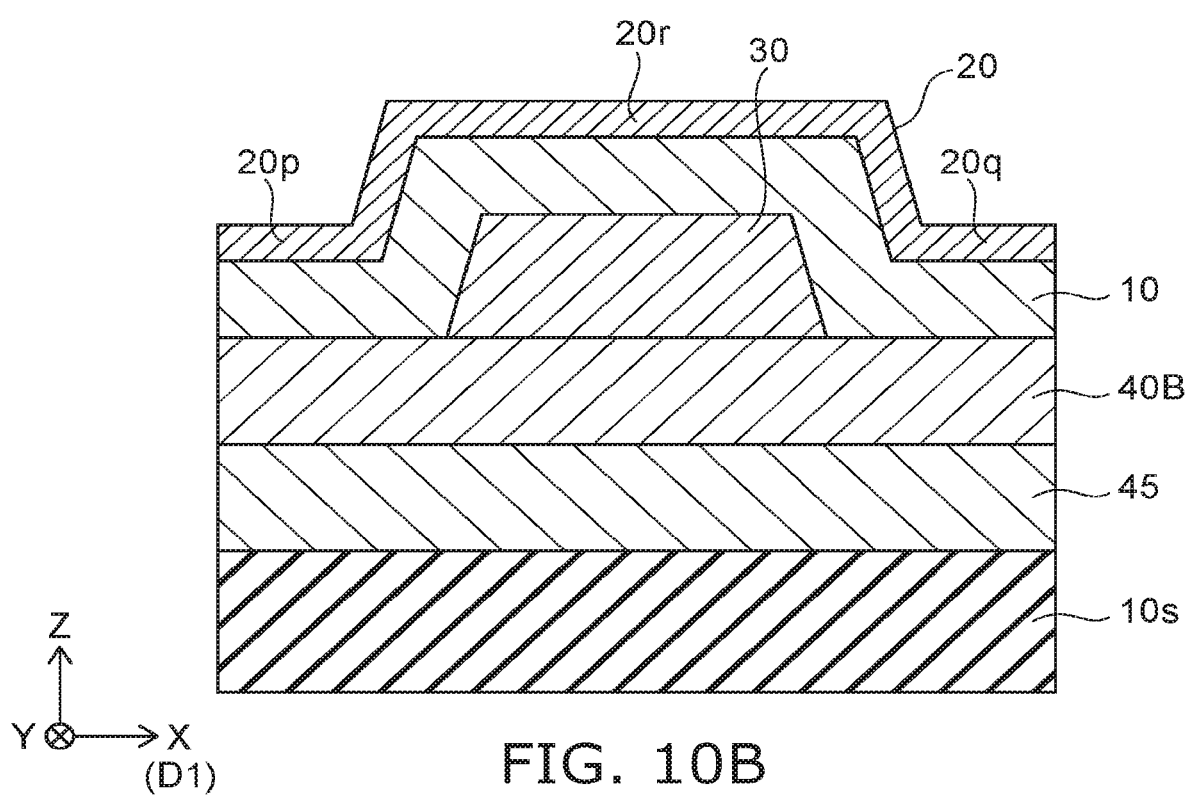

As shown in FIG. 10B, the second semiconductor layer 20 is formed on the first semiconductor layer 10. The second semiconductor layer 20 includes $Al_{x2}Ga_{1-x2}N$ ($0 < x2 \leq 1$ and $x1 < x2$).

The second semiconductor layer 20 includes a first portion 20p, a second portion 20q, and a third portion 20r. The third portion 20r is above the third semiconductor layer 30.

The position of the third portion 20r in the first direction D1, which is from the first portion 20p toward the second portion 20q, is between the position of the first portion 20p in the first direction D1 and the position of the second portion 20q in the first direction D1.

Subsequently, the first insulating member 61, the first electrode 51, the second electrode 52, and the third electrode 53 are formed (referring to FIG. 8). The first electrode 51 is electrically connected to the first portion 20p. The second electrode 52 is electrically connected to the second portion 20q. The third electrode 53 is electrically connected to the third portion 20r (referring to FIG. 10B).

By such a method, the semiconductor device 120 can be efficiently manufactured. According to the third embodiment, a method for manufacturing a semiconductor device can be provided in which stable characteristics are obtained.

Figure 11:
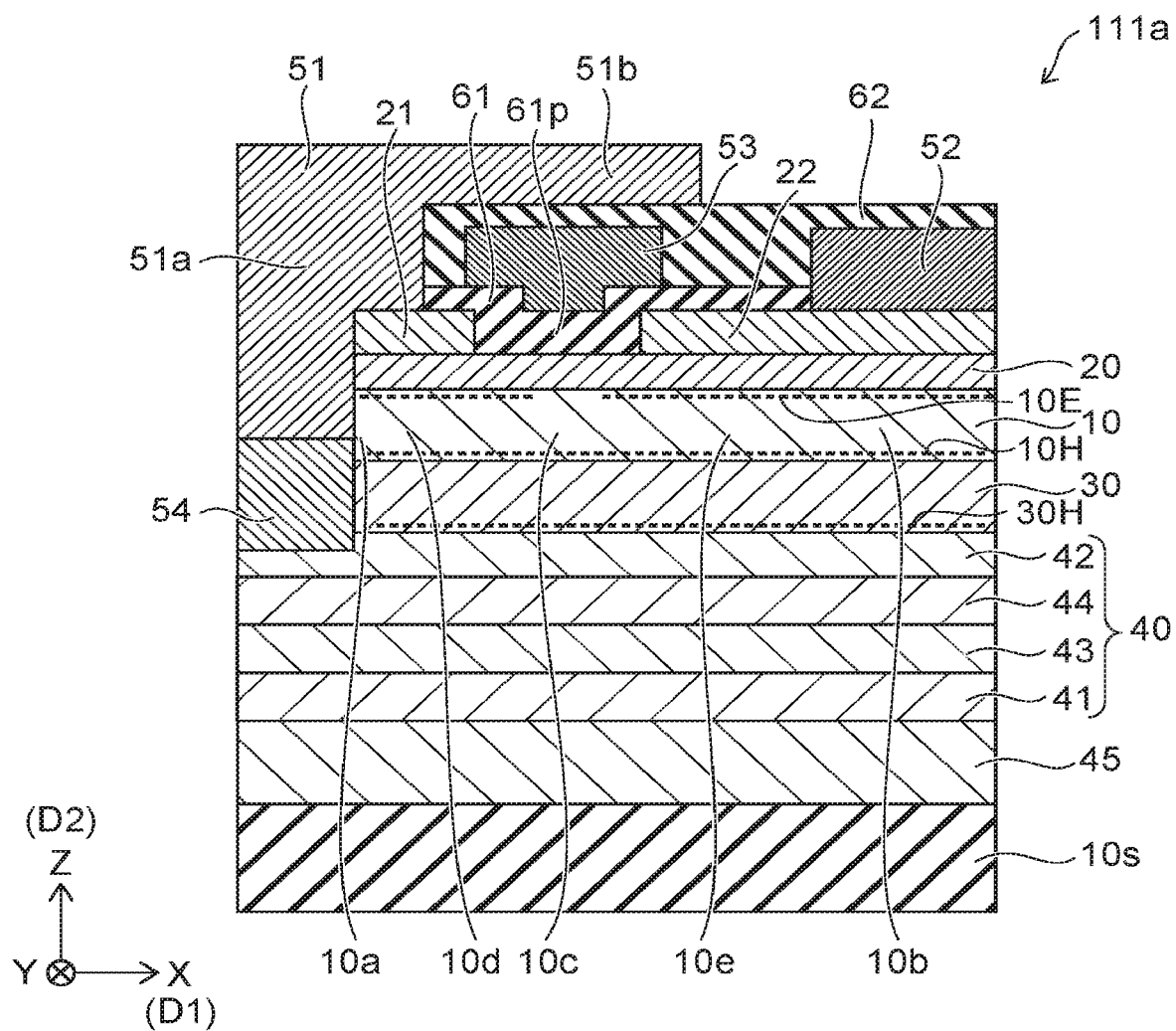
FIG. 11 is a schematic cross-sectional view illustrating a semiconductor device according to an embodiment.

FIG. 11 is a schematic cross-sectional view illustrating a semiconductor device according to an embodiment.

As shown in FIG. 11, in the semiconductor device 111a, the semiconductor layer 45 is provided in addition to the first electrode 51, the second electrode 52, the third electrode 53, the first semiconductor layer 10, the second semiconductor layer 20, the third semiconductor layer 30, the first insulating member 61, the fourth semiconductor layer 40, and the substrate 10s. The semiconductor layer 45 is provided between the substrate 10s and the fourth semiconductor layer 40. The semiconductor layer 45 is a buffer layer, for example. The semiconductor layer 45 includes AlN, for example. Otherwise, the configuration of the semiconductor device 111a is similar to the configuration of the semiconductor device 111. For example, the first semiconductor region 41 is provided between the semiconductor layer 45 and the second semiconductor region 42. Stable characteristics are obtained in the semiconductor device 111a, for example.

According to the embodiments, a semiconductor device and a method for manufacturing the semiconductor device can be provided in which stable characteristics are obtained.

In the embodiment, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor layer including $Al_{x1}Ga_{1-x1}N$ ($0 \leq x1 < 1$), the first semiconductor layer including a first partial region, a second partial region, a third partial region, a fourth partial region, and a fifth partial region, a direction from the first partial region toward the second partial region being along a first direction, a position in the first direction of the third partial region being between a position in the first direction of the first partial region and a position in the first direction of the second partial region, a position in the first direction of the fourth partial region being between the position in the first direction of the first partial region and the position in the first direction of the third partial region, a position in the first direction of the fifth partial region being between the position in the first direction of the third partial region and the position in the first direction of the second partial region;
   a first electrode including a first electrode portion;
   a second electrode, a direction from the first electrode portion toward the second electrode being along the first direction;
   a third electrode, a position of the third electrode in the first direction being between a position of the first electrode portion in the first direction and a position of the second electrode in the first direction, a second direction from the third partial region toward the third electrode crossing the first direction;
   a second semiconductor layer including $Al_{x2}Ga_{1-x2}N$ ($0 < x2 \leq 1$ and $x1 < x2$), the second semiconductor layer including a first semiconductor portion and a second semiconductor portion, a direction from the fourth partial region toward the first semiconductor portion being along the second direction, a direction from the fifth partial region toward the second semiconductor portion being along the second direction;
   a third semiconductor layer including magnesium and $Al_{x3}Ga_{1-x3}N$ ($0 < x3 < 1$ and $x1 < x3$), at least a portion of the first semiconductor layer being between the third semiconductor layer and the second semiconductor layer; and
   a first insulating member including a first insulating portion, the first insulating portion being provided between the third partial region and the third electrode.

2. The device according to claim 1, further comprising:
   a fourth semiconductor layer including $Al_{x4}Ga_{1-x4}N$ ($0 < x4 < 1$ and $x1 < x4$), the third semiconductor layer being between the fourth semiconductor layer and the second semiconductor layer in the second direction, the first semiconductor layer being between the third semiconductor layer and the second semiconductor layer in the second direction, the fourth semiconductor layer including a first semiconductor region and a second semiconductor region, the second semiconductor region being between the first semiconductor region and the third semiconductor layer, a composition ratio of Al in the first semiconductor region being greater than a composition ratio of Al in the second semiconductor region.

3. The device according to claim 1, further comprising:
a fourth semiconductor layer including $Al_{x4}Ga_{1-x4}N$ (0<x4<1 and x1<x4), the third semiconductor layer being between the fourth semiconductor layer and the second semiconductor layer in the second direction, the first semiconductor layer being between the third semiconductor layer and the second semiconductor layer in the second direction, a composition ratio of Al in the fourth semiconductor layer decreasing in an orientation from the fourth semiconductor layer toward the third semiconductor layer.

4. The device according to claim 2, wherein
a composition ratio of Al in the third semiconductor layer is not more than a minimum value of the composition ratio of Al in the fourth semiconductor layer.

5. The device according to claim 4, wherein
the minimum value of the composition ratio of Al in the fourth semiconductor layer is not less than 0.15 and not more than 0.4.

6. The device according to claim 2, wherein
a maximum value of the composition ratio of Al in the fourth semiconductor layer is greater than 0.4 and not more than 0.8.

7. The device according to claim 1, further comprising:
a fourth semiconductor layer including magnesium and $Al_{x4}Ga_{1-x4}N$ (0≤x4<1 and x4<x3), the third semiconductor layer being between the fourth semiconductor layer and the second semiconductor layer in the second direction, the first semiconductor layer being between the third semiconductor layer and the second semiconductor layer in the second direction, a concentration of magnesium in the fourth semiconductor layer being greater than a concentration of magnesium in the third semiconductor layer.

8. The device according to claim 7, wherein
the concentration of magnesium in the third semiconductor layer is less than $2\times10^{18}$ $cm^{-3}$, and
the concentration of magnesium in the fourth semiconductor layer is $2\times10^{18}$ $cm^{-3}$ or more.

9. The device according to claim 7, wherein
an average value of the magnesium concentration in the third semiconductor layer is not more than $\frac{1}{10}$ of an average value of the magnesium concentration in the fourth semiconductor layer.

10. The device according to claim 1, wherein
a concentration of carbon in the third semiconductor layer is less than a concentration of carbon in the first semiconductor layer.

11. The device according to claim 1, wherein
the fourth partial region is between the third semiconductor layer and the first semiconductor portion in the second direction,
the third partial region is between the third semiconductor layer and the third electrode in the second direction, and
a direction from the third semiconductor layer toward the second partial region is along the first direction.

12. The device according to claim 1, further comprising:
a conductive member,
the conductive member contacting the third semiconductor layer and the first electrode portion.

13. The device according to claim 12, wherein
the conductive member includes at least one selected from the group consisting of Ni, Pd, Ag, and Au.

14. The device according to claim 12, wherein
the first electrode portion includes at least one selected from the group consisting of Ti and Al.

15. The device according to claim 1, wherein
a direction from the first semiconductor portion toward at least a portion of the first insulating portion is along the first direction.

* * * * *